(12) United States Patent  (10) Patent No.: US 8,367,549 B2
Kwon  (45) Date of Patent: Feb. 5, 2013

(54) METHOD OF MANUFACTURING SEMICONDUCTOR DEVICE

(75) Inventor: Young Soo Kwon, Hwaseong-si (KR)

(73) Assignee: Wonik IPS Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/845,481

(22) Filed: Jul. 28, 2010

(65) Prior Publication Data

US 2011/0034036 A1   Feb. 10, 2011

(30) Foreign Application Priority Data

Aug. 5, 2009   (KR) .................. 10-2009-0071969

(51) Int. Cl.
*H01L 21/44*   (2006.01)

(52) U.S. Cl. ................. 438/682; 438/630; 257/E21.002

(58) Field of Classification Search .................. 438/627, 438/653, 763, 775, 776, 630, 682, 758, 761; 257/E21.002
See application file for complete search history.

(56) References Cited

U.S. PATENT DOCUMENTS

| | | | |
|---|---|---|---|
| 6,194,315 B1 * | 2/2001 | Hu et al. | 438/683 |
| 6,348,420 B1 * | 2/2002 | Raaijmakers et al. | 438/769 |
| 6,656,840 B2 * | 12/2003 | Rajagopalan et al. | 438/687 |
| 7,985,674 B2 * | 7/2011 | Kim et al. | 438/622 |
| 2002/0155702 A1 * | 10/2002 | Aoki et al. | 438/653 |

FOREIGN PATENT DOCUMENTS

| | | |
|---|---|---|
| JP | 2009-130369 | 6/2009 |
| KR | 100564433 B1 | 3/2006 |
| KR | 1020080072073 A | 8/2008 |

OTHER PUBLICATIONS

T. Usami et al., "Highly Reliable Interface of Self-aligned CuSiN process with Low-k SiC barrier dielectric (k=3.5) for 65nm node and beyond," IEEE, 2006 (pp. 125-127).

* cited by examiner

*Primary Examiner* — Leonard Chang

(57) ABSTRACT

Provided is a method of manufacturing a semiconductor device. In the method, after a thin liner is formed on a substrate on which a lower interconnection is formed, a silicon source is supplied to form a silicide layer under the liner by a reaction between the silicon source and the lower interconnection, and the silicide layer is nitrided and an etch stop layer is formed. Therefore, the lower interconnection is prevented from making contact with the silicon source, variations of the surface resistance of the lower interconnection can be prevented, and thus high-speed devices can be fabricated.

9 Claims, 5 Drawing Sheets

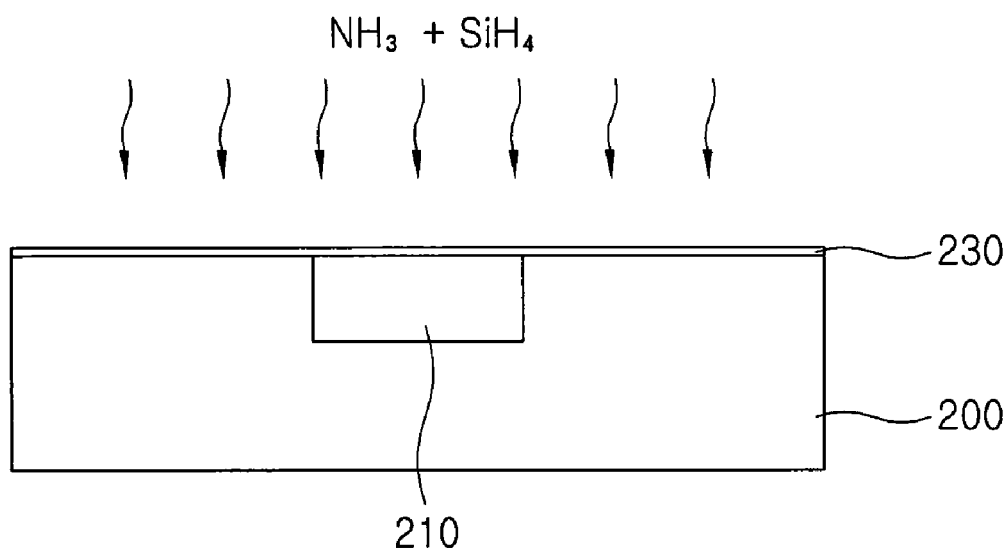
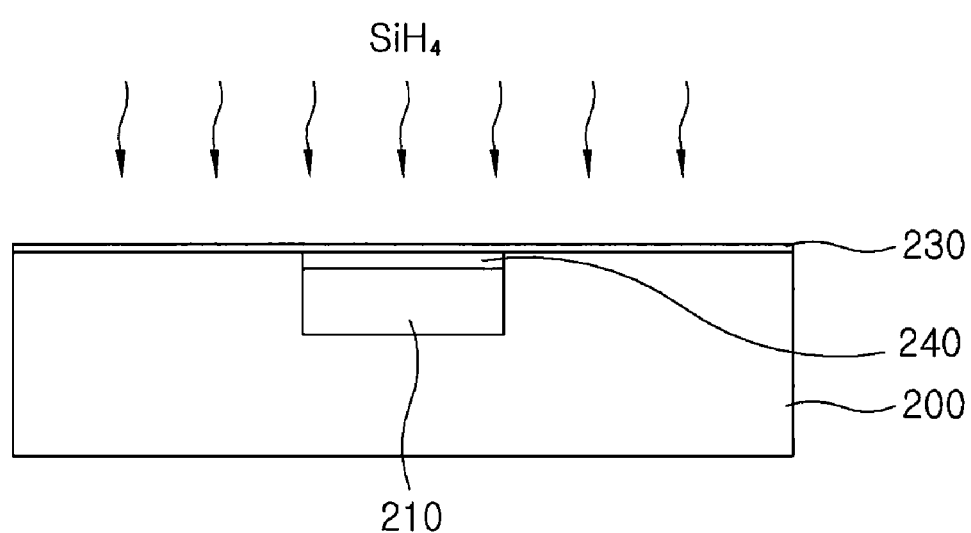

METHOD OF MANUFACTURING SEMICONDUCTOR DEVICE

CROSS-REFERENCE TO RELATED APPLICATION

This application claims priority to Korean Patent Application No. 10-2009-0071969 filed on Aug. 5, 2009 and all the benefits accruing therefrom under 35 U.S.C. §119, the contents of which are incorporated by reference in their entirety.

BACKGROUND

The present disclosure relates to a method of manufacturing a semiconductor device, and more particularly, to a method of manufacturing a semiconductor device by forming a silicide layer on an interconnection after forming a liner.

As recent semiconductor devices are highly integrated and operate at high speeds, fine and multi-layer interconnections are used in the semiconductor devices. In addition, so as to reduce RC signal delays, copper is used as an interconnection material, and materials having a low dielectric constant (k) are used as insulation layer materials. Moreover, difficulties in metal patterning caused by design rule reduction have led to the development of a damascene process in which metal etching and insulation layer gap filling are not performed in an interconnection forming process.

In a damascene process, an etch stop layer and an interlayer insulation layer are formed on a substrate where lower interconnections are formed of copper; predetermined regions of the etch stop layer and the interlayer insulation layer are etched to form holes or trenches; and the holes or trenches are filled with a metal layer to form metal interconnections. At this time, a silicide layer may be formed on the lower interconnections, and the silicide layer may be nitrided to improve interconnection characteristics. The silicide layer may be formed by reaction with the lower interconnections. That is, the silicide layer may be formed by reaction between copper and a silicon source such as $SiH_4$.

However, if copper and $SiH_4$ make contact with each other and react with each other, the surface resistance of the lower interconnections may be varied to increase resistance such as via resistance or interconnection resistance after a device is completely fabricated. As a result, the operation of the device may be undesirably affected. For example, the device may not operate at a high speed.

SUMMARY

The present disclosure provides a method of manufacturing a semiconductor device. In the method, a lower interconnection is prevented from making contact with a silicon source when a silicide layer is formed, so that resistance variation can be prevented.

The present disclosure also provides a method of manufacturing a semiconductor device, in which a thin liner is formed on a semiconductor substrate before a silicide layer is formed so as to prevent a lower interconnection from making contact with a silicon source.

In accordance with an exemplary embodiment, there is provided a method of manufacturing a semiconductor device, the method including: preparing a semiconductor substrate on which a lower interconnection is formed; forming a liner on the semiconductor substrate; forming a silicide layer on the lower interconnection under the liner; nitriding the silicide layer; and depositing a thin layer on the liner.

The forming of the liner, the nitriding of the silicide layer, and the depositing of the thin layer may be performed by generating plasma, and the forming of the silicide layer may be performed without generating plasma.

The forming of the liner, the forming of the silicide layer, the nitriding of the silicide layer, and the depositing of the thin layer may be performed in situ.

The liner and the thin layer may be formed of the same material.

In accordance with another exemplary embodiment, there is provided a method of manufacturing a semiconductor device, the method including: preparing a semiconductor substrate on which a lower interconnection is formed; forming a liner on the semiconductor substrate by using a first source and a second source; forming a silicide layer on the lower interconnection under the liner by using the second source; nitriding the silicide layer by using the first source; and depositing a thin layer by using the first and second sources.

Prior to the forming of the liner, the method may further include removing a natural oxide layer from the semiconductor substrate by using the first source.

A purge gas may be supplied at the same time when the first source is supplied or after a predetermined delay time, and the purge gas may be supplied at a constant flow rate or a gradually increasing flow rate.

The forming of the liner, the nitriding of the silicide layer, and the depositing of the thin layer may be performed by generating plasma, and the forming of the silicide layer may be performed without generating plasma.

The forming of the liner, the forming of the silicide layer, the nitriding of the silicide layer, and the depositing of the thin layer may be performed in situ.

The liner and the thin layer may be formed of the same material, and each of the liner and the thin layer may have properties varying according to a ratio of the first and second sources.

BRIEF DESCRIPTION OF THE DRAWINGS

Exemplary embodiments can be understood in more detail from the following description taken in conjunction with the accompanying drawings, in which:

FIGS. 2 through 8 are sequential sectional views of a device for explaining a method of a manufacturing a semiconductor device in accordance with an exemplary embodiment.

DETAILED DESCRIPTION OF EMBODIMENTS

Figure 1:
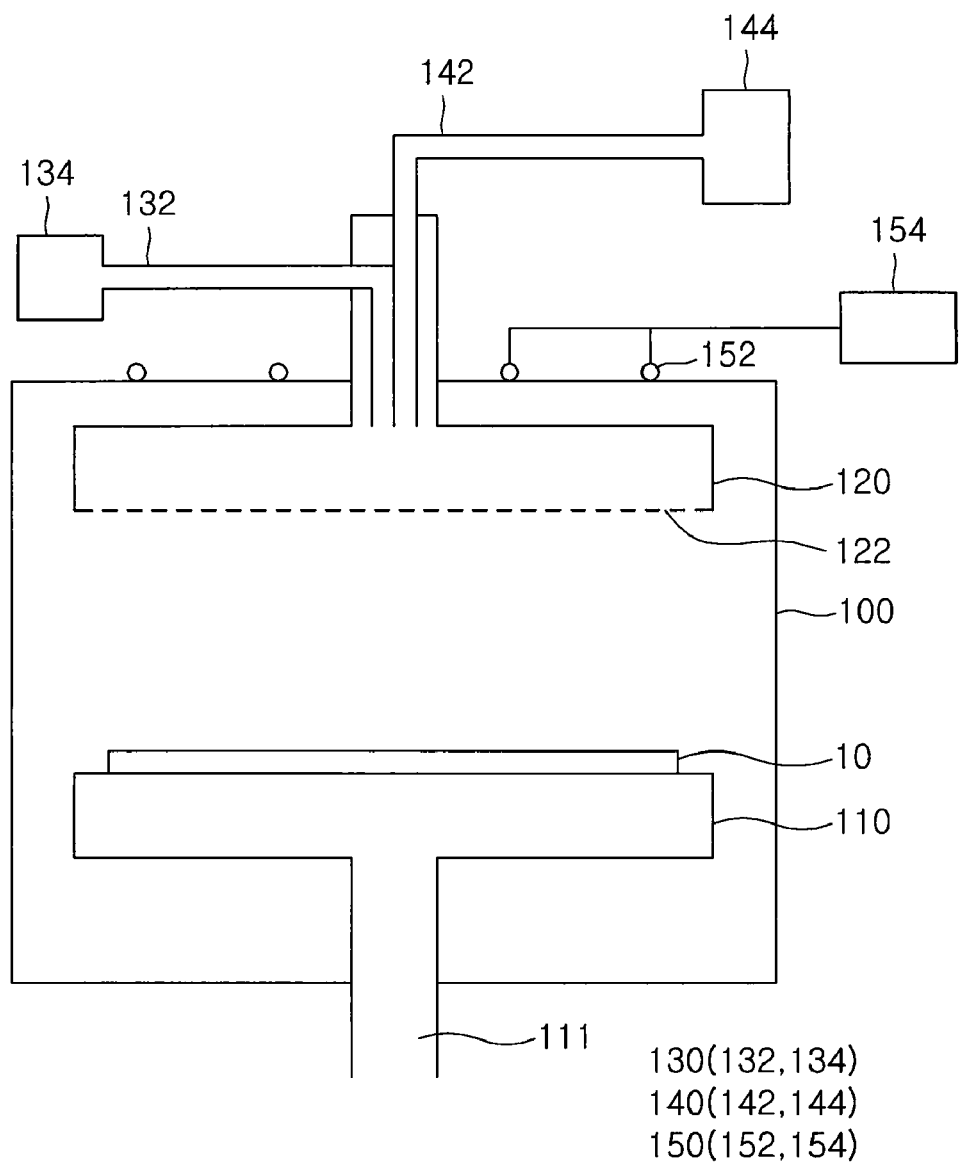
FIG. 1 is a schematic sectional view illustrating a reaction apparatus in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present. Further, it will be understood that when a layer, a film, a region or a plate is referred to as being 'under' another one, it can be directly under the other one, and one or more intervening layers, films, regions or plates may also be present. In addition, it will also be understood that when a layer, a film, a region or a plate is referred to as being 'between' two layers, films, regions or plates, it can be the only layer, film, region or plate between the two layers, films, regions or plates, or one or more intervening layers, films, regions or plates may also be present.

FIG. 1 is a schematic sectional view illustrating a reaction apparatus that can be used for a method of manufacturing a semiconductor device in accordance with an exemplary embodiment. In the reaction apparatus, both the etching and deposition processes may be performed by using plasma.

Referring to FIG. 1, the reaction apparatus of the current embodiment includes a reaction chamber 100 in which a reaction spaced is formed; a substrate support 110 disposed in a lower inner side of the reaction chamber 100 to support a substrate 10; a shower head 120 disposed at an upper inner side of the reaction chamber 100 and facing the substrate support 110 to inject a reaction source; a first source supply unit 130 configured to supply a first source to the shower head 120; a second source supply unit 140 configured to supply a second source to the shower head 120; a plasma generating unit 150 configured to excite first and second sources injected through the shower head 120.

The reaction chamber 100 provides an airtight reaction region. The reaction chamber 100 may include: a reaction part constituted by a flat part having an approximately circular shape and a sidewall part extending upward from the flat part to form a predetermined space; and a circular cover having an approximately circular shape and disposed on the reaction part to keep the reaction chamber 100 airtight. The reaction part and the cover may have other shapes such as a shape corresponding to the shape of a substrate 10.

The substrate support 110 is disposed at a lower side of the reaction chamber 100 to face the shower head 120. For example, the substrate support 110 may include an electrostatic chuck to receive a substrate 10 carried into the reaction chamber 100. The substrate support 110 may have an approximately circular shape or any other shape corresponding to the shape of a substrate 10. The size of the substrate support 110 may be greater than that of a substrate 10. A substrate elevator 111 is disposed under the substrate support 110 to raise or lower a substrate 10 placed on the substrate support 110. If a substrate 10 is placed on the substrate support 110, the substrate elevator 111 moves the substrate 10 close to the shower head 120. In addition, a heater (not shown) is disposed in the substrate support 110. The heater heats a substrate 10 so that processes performed using first and second sources, such as a natural oxide layer removing process, a silicide layer forming process, and an etch stop layer forming process, may be easily performed on the substrate 10. A cooling conduit (not shown) may also be disposed in the substrate support 110 in addition to the heater. A coolant may be circulated through the cooling conduit disposed in the substrate support 110 to cool a substrate 10 by conduction between the substrate 10 and the substrate support 110 for adjusting the temperature of the substrate 10 to a desired level.

The shower head 120 is disposed at an upper side in the reaction chamber 100 to face the substrate support 110 to inject first and second sources toward the lower side of the reaction chamber 100. The upper part of the shower head 120 is connected to the first source supply unit 130 and the second source supply unit 140, and a plurality of injection holes 122 are formed in the bottom side of the shower head 120 to inject first and second sources. The shower head 120 may have an approximately circular shape or any other shape corresponding to the shape of a substrate 10. The size of the shower head 120 may be equal to the size of the substrate support 110.

The first source supply unit 130 includes a first source supply pipe 132 connected to the upper part of the shower head 120 to supply a first source to the shower head 120; and a first source storing part 134 configured to store a first source. The first source storing part 134 stores a nitrogen source such as $NH_3$. The nitrogen source may be used to remove a natural oxide layer and form a silicon nitride (SiN) layer as a liner or an etch stop layer. In addition, the first source storing part 134 may store another source such as a $H_2$ source as well as the nitrogen source for removing a natural oxide layer. In this case, the first source storing part 134 may store the $NH_3$ source and the $H_2$ source separately. A first source stored in the first source storing part 134 is supplied to the shower head 120 through the first source supply pipe 132. A device such as a valve (not shown) is disposed between the first source storing part 134 and the first source supply pipe 132 to control supply of a first source, for example, the supply flow rate of a first source.

The second source supply unit 140 includes: a second source supply pipe 142 connected to the upper part of the shower head 120 to supply a second source to the shower head 120; and a second source storing part 144 configured to store a second source. The second source storing part 144 stores a source to form a silicon nitride layer as a liner or an etch stop layer, and a silicide layer. For example, the second source storing part 144 may store a silicon source such as $SiH_4$. A second source stored in the second source storing part 144 is supplied to the shower head 120 through the second source supply pipe 142. A device such as a valve (not shown) is disposed between the second source storing part 144 and the second source supply pipe 142 to control supply of a second source, for example, the supply flow rate of a second source.

The plasma generating unit 150 is configured to excite at least one of a first source and a second source. The plasma generating unit 150 includes: a plasma generating coil 152 disposed at an upper part or a side part of the reaction chamber 100 or plasma generating coils 152 disposed at both the upper and side parts of the reaction chamber 100; and a power supply part 154 configured to supply power to the plasma generating coil(s) 152. In the case where plasma generating coils 152 are disposed at the upper and side parts of the reaction chamber 100, the plasma generating coils 152 may be connected in parallel. The plasma generating coil 152 disposed at the upper part of the reaction chamber 100 may have an outer diameter greater than the shower head 120 so as to completely ionize a first source and a second source injected through the shower head 120. When power is supplied to the plasma generating coil 152 from the power supply part 154, a magnetic field is generated by the plasma generating coil 152 to excite a first source and a second source.

In addition, a vacuum pump (not shown) may be provided to control the inside pressure of the reaction chamber 100, a discharge outlet (not shown) may be provided to discharge unreacted gas from the reaction chamber 100, and a purge gas supply unit (not shown) may be provided to supply a purge gas.

FIGS. 2 through 8 are sequential sectional views for explaining a method of a manufacturing a semiconductor device in accordance with an exemplary embodiment.

Figure 2:
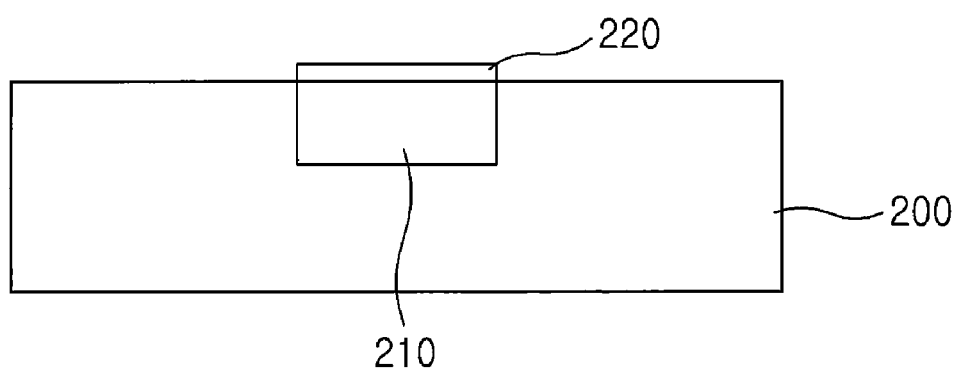

Referring to FIG. 2, a semiconductor substrate 200 on which a predetermined structure is formed is loaded into the reaction chamber 100. For example, devices such as transistors or memory cells may have been formed on the semiconductor substrate 200, and a lower interconnection 210 may have been formed on the semiconductor substrate 200. The semiconductor substrate 200 may be exposed to the atmosphere, for example, while the semiconductor substrate 200 is transported, and in this case, a natural oxide layer 220 may be grown on the lower interconnection 210. If the lower interconnection 210 is formed of copper, the natural oxide layer 220 may be a copper oxide (CuO) layer. When the semiconductor substrate 200 on which the lower interconnection 210 is formed is loaded into the reaction chamber 100, the semiconductor substrate 200 is placed on the substrate support 110, and the substrate elevator 111 is moved upward to adjust the gap between the reaction chamber 100 and the shower head 120.

Figure 3:
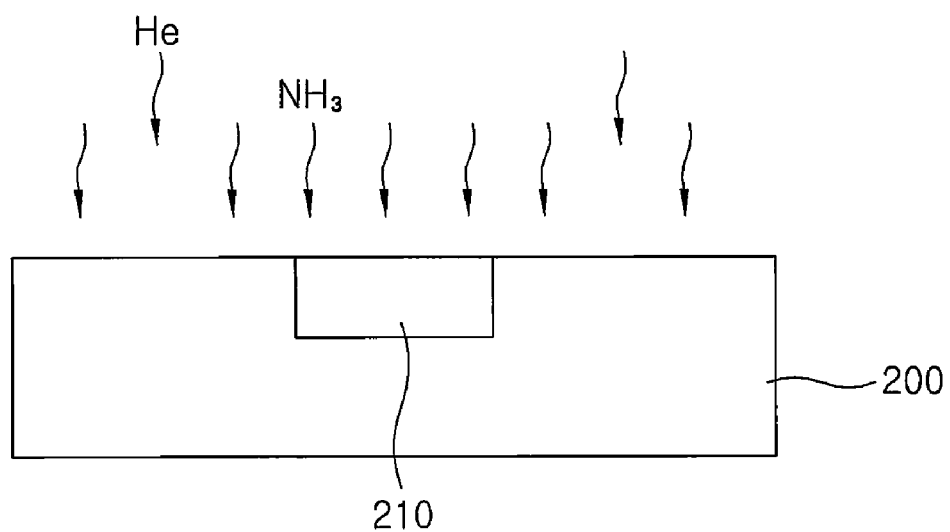

Referring to FIG. 3, the semiconductor substrate 200 is kept at a predetermined temperature, for example, in the range from approximately 300° C. to approximately 400° C. by using the heater (not shown) disposed in the substrate support 110, and the inside of the reaction chamber 100 is kept at a predetermined pressure, for example, a vacuum state, by using a device such as the vacuum pump (not shown). Since the natural oxide layer 220 increases interconnection resistance, the natural oxide layer 220 may be removed. For this, a first source such as $NH_3$ is supplied to the shower head 120 from the first source supply unit 130, and along with this, for example, a power of approximately 850 W is applied to the plasma generating unit 150 to generate a high frequency of approximately 13.56 MHz. By the high frequency, plasma is generated. When the supply of the first source is started or after a time during which the natural oxide layer 220 can be almost removed, a purge gas such as nitrogen ($N_2$) gas or Helium (He) gas is supplied with a gradually increasing flow rate. For example, the first source may be supplied from the first source supply unit 130 at a flow rate of approximately 300 sccm to approximately 5000 sccm, and the purge gas may be supplied at a flow rate of approximately 300 sccm to approximately 5000 sccm. The supply flow rate of the purge gas may be gradually increased from a flow rate of approximately 100 sccm. If the first source is supplied and plasma is generated in this way, the natural oxide layer 220 may be removed after 10 seconds to 20 seconds. At the time when the natural oxide layer 220 is removed, the first source may be purged.

Referring to FIG. 4, after the first source is supplied for a predetermined, that is, after a predetermined time during which the natural oxide layer 220 may be removed, a second source such as $SiH_4$ is supplied from the second source supply unit 140. For example, after the first source is supplied for approximately 10 seconds to approximately 20 seconds, the second source is supplied form the second source supply unit 140. At this time, the supply flow rate of the first source is reduced or kept at the same level. For example, the first source may be supplied at a flow rate of approximately 300 sccm to approximately 5000 sccm, and the second source may be supplied at a flow rate of approximately 100 sccm to approximately 1000 sccm. In addition, the plasma generating unit 150 applies a power of, for example, 850 W to generate a high frequency of approximately 13.56 MHz for generating plasma with the high frequency. Therefore, a liner 230 is formed on the semiconductor substrate 200 by the first and second sources. The liner 230 may be a silicon nitride layer formed of a nitrogen source and a silicon source, and the properties of the silicon nitride layer may be variously changed according to the ratio of the nitrogen source and the silicon source. The liner 230 is formed to a small thickness of, for example, approximately 1 Å to approximately 50 Å so that the second source can react with the lower interconnection 210. When the liner 230 is formed, the second source included in the liner 230 or the first and second sources may partially react with the lower interconnection 210, and thus a thin silicide layer or a thin silicide nitride layer may be formed.

Referring to FIG. 5, the operation of the plasma generating unit 150 is stopped not to generate plasma in a state where supply of the first source is stopped or maintained and supply of the second source is maintained. For example, the supply flow rate of the second source may be kept in the range from approximately 100 sccm to approximately 1000 sccm, and supply of the first source may be stopped or maintained. As a result, a silicide layer 240 is formed on the lower interconnection 210 which is disposed under the liner 230. After the liner 230 is formed, supply of the second source may be maintained but supply of the first source may be stopped. That is, at the liner 230 is formed, supplies of the first and second sources may be stopped, and after purging the first and second sources, the second source may be supplied again to form a silicide layer 240. Alternatively, after the liner 230 is formed, a silicide layer 240 may be formed by stopping supply of the first source but maintaining supply of the second source. Since the lower interconnection 210 is formed of copper, the silicide layer 240 may be a copper silicide (CuSix) layer. At this time, as well as the silicide layer 240, a silicide nitride layer may be formed. Since the lower interconnection 210 is formed of copper, the silicide nitride layer may be a copper silicide nitride (CuSiN) layer. At this time, the copper silicide nitride layer is unstable.

Figure 6:
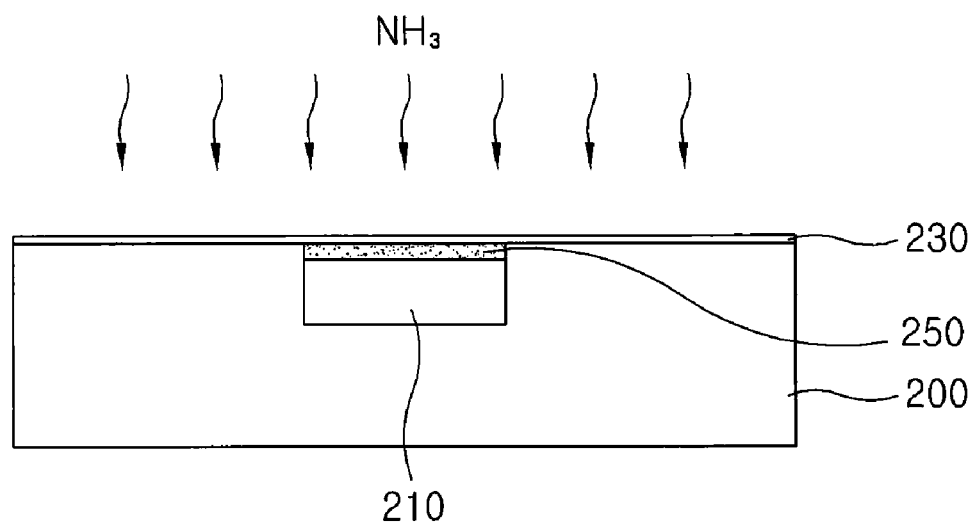

Referring to FIG. 6, supply of the second source is stopped, and the first source is supplied again. Along with this, the plasma generating unit 150 applies a power of, for example, approximately 200 W, to generate a high frequency of approximately 13.56 MHz for generating plasma with the high frequency. At this time, the first source may be supplied at a flow rate of approximately 100 sccm to approximately 600 sccm. As a result, the silicide layer 240 or the unstable copper silicide nitride layer is changed into a stable copper silicon nitride (CuSiN) layer 250 by the plasma of the first source such as $NH_3$. At this time, the copper silicon nitride layer 250 may be formed by stopping supply of the second source, purging the second source, and supplying the first source again, or the copper silicon nitride layer 250 may be formed by stopping supply of the second source and simultaneously re-supplying the first source without a purge process.

Figure 7:
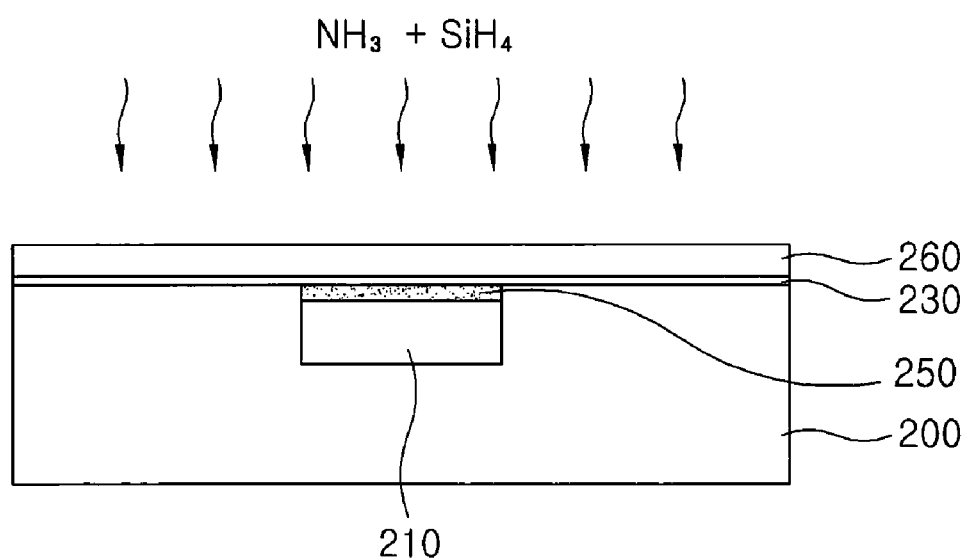

Referring to FIG. 7, the plasma generating unit 150 applies a power of, for example, approximately 200 W, to generate a high frequency of approximately 13.56 MHz for generating plasma with the high frequency, and the first and second sources are supplied to deposit a silicon nitride (SiN) layer on the semiconductor substrate 200 as an etch stop layer 260. At this time, the etch stop layer 260 may be deposited by purging the first source after the copper silicon nitride layer 250 is formed and supplying the first and second sources simultaneously, or the etch stop layer 260 may be formed by maintaining supply of the first source and re-supplying the second source.

Figure 8:
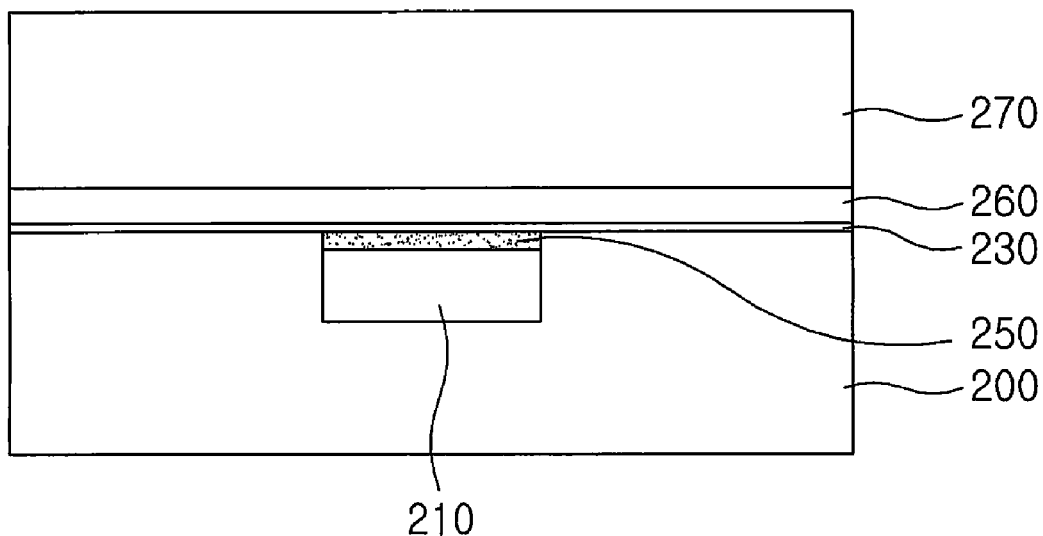

Referring to FIG. 8, an interlayer insulation layer 270 is formed on the etch stop layer 260. The interlayer insulation layer 270 is formed of a material the etch rate of which is largely different from the etch rate of a material used for forming the etch stop layer 260. That is, since the etch stop layer 260 is a silicon nitride layer, the interlayer insulation layer 270 may be an oxide layer. In addition, the interlayer insulation layer 270 may be formed of a material having a low dielectric constant. For example, the interlayer insulation layer 270 may be formed of a material having a low dielectric constant, such as a porous silicon oxide, PSG (phosphorous silicate glass), BPSG (boron phosphorous silicate glass), USG (undoped silicate glass), FSG (fluorine doped silicate glass), SiOC, HDP (high density plasma), PE-TEOS (plasma enhanced-tetra ethyl ortho silicate), or SOG (spin on glass). The interlayer insulation layer 270 may be formed in a reaction chamber different from the reaction chamber 100. That is, the interlayer insulation layer 270 may be formed after unloading the semiconductor substrate 200 on which the etch stop layer 260 is formed from the reaction chamber 100 and loading the semiconductor substrate 200 into another reaction chamber.

In the above-described embodiment, the liner 230 is formed on the semiconductor substrate 200 where the lower interconnection 210 is formed. However, a liner 230 may be formed on a semiconductor substrate 200 where a lower interconnection 210 is not formed or a different structure is formed. In this case, a lower surface of the liner 230, or the liner 230 may be altered through a predetermined process using first and second sources.

As described above, after a thin liner is formed on a substrate on which a lower interconnection is formed, a silicon source is supplied to form a silicide layer under the liner by a reaction between the silicon source and the lower interconnection. The liner may be formed of the same material as that used for depositing a layer after the liner is formed. For example, if a silicon nitride layer is formed as an etch stop layer, the liner may be formed of a silicon nitride.

Therefore, since the lower interconnection is prevented from making contact with the silicon source, variations of the surface resistance of the lower interconnection can be prevented, and thus high-speed devices can be fabricated.

Although the method of manufacturing a semiconductor device has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A method of manufacturing a semiconductor device, the method comprising:
preparing a semiconductor substrate on which a lower interconnection is formed;
removing a natural oxide layer from the lower interconnection by using a first source in conjunction with generating a plasma;
forming a liner on the semiconductor substrate including on the lower interconnection by using the first source and a second source, wherein the first source is different from the second source;
forming a silicide layer on the lower interconnection under the liner by using the second source;
after forming the silicide layer, nitriding the silicide layer by using the first source and stopping supply of the second source; and
after nitriding the silicide layer, depositing a thin layer by using the first and second sources.

2. The method of claim 1, wherein a purge gas is supplied at the same time when the first source is supplied or after a predetermined delay time.

3. The method of claim 2, wherein the purge gas is supplied at a constant flow rate or a gradually increasing flow rate.

4. The method of claim 1, wherein the liner and the thin layer are formed of the same material.

5. The method of claim 1, wherein each of the liner and the thin layer has properties varying according to a ratio of the first and second sources.

6. The method of claim 1, wherein the forming of the liner, the nitriding of the silicide layer, and the depositing of the thin layer are performed by generating plasma.

7. The method of claim 6, wherein the forming of the silicide layer is performed without generating plasma.

8. The method of claim 7, wherein the removing of the natural oxide, the forming of the liner, the forming of the silicide layer, the nitriding of the silicide layer, and the depositing of the thin layer are performed in situ.

9. The method of claim 1, wherein the first source is a nitride containing gas and the second source is a silicon containing gas.

* * * * *